(12) United States Patent
Kwon et al.

(10) Patent No.: US 7,521,657 B2
(45) Date of Patent: *Apr. 21, 2009

(54) ASSEMBLY HAVING WAFER WITH IMAGE SENSOR CHIPS, A PHOTO-SENSITIVE ADHESIVE PATTERN AND PLATE THEREOF AND METHOD OF MANUFACTURING THE SAME

(75) Inventors: Yong-Chai Kwon, Suwon-si (KR); Kang-Wook Lee, Suwon-si (KR); Gu-Sung Kim, Seongnam-si (KR); Keum-Hee Ma, Andong-si (KR); Seong-Il Han, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 667 days.

This patent is subject to a terminal disclaimer.

(21) Appl. No.: 11/149,298

(22) Filed: Jun. 10, 2005

(65) Prior Publication Data

US 2006/0152615 A1  Jul. 13, 2006

(30) Foreign Application Priority Data

Jan. 7, 2005 (KR) .................. 10-2005-0001683

(51) Int. Cl.
  *H01L 27/00* (2006.01)
(52) U.S. Cl. ................... 250/208.1; 250/239
(58) Field of Classification Search ........... 250/208.1, 250/239, 214.1; 257/432–435, 440, 666–680; 438/25–29
See application file for complete search history.

(56) References Cited

U.S. PATENT DOCUMENTS 6,518,656 B1 * 2/2003 Nakayama et al. .......... 257/680
6,737,292 B2   5/2004 Seo

FOREIGN PATENT DOCUMENTS

| JP | 2000-183205 | 6/2000 |
|----|-------------|--------|
| JP | 2003-163342 | 6/2003 |
| JP | 2004-088082 | 3/2004 |
| JP | 2004-193600 | 7/2004 |
| KR | 2003091389  | 3/2003 |

OTHER PUBLICATIONS

Korean Office Action dated Jun. 26, 2006.

* cited by examiner

*Primary Examiner*—Que T Le
(74) *Attorney, Agent, or Firm*—Harness, Dickey & Pierce, P.L.C.

(57) ABSTRACT

An assembly may include a wafer and a plate may be mounted on the wafer. The wafer may have image sensor chips and scribe lines demarcating each image sensor chip. The image sensor chip may include an active surface. Chip pads and a micro-lens may be provided on the active surface. A photo-sensitive adhesive pattern may be provided between the plate and a region of the active surface between the chip pads and the micro-lens. An image sensor device implementing an image sensor chip having an individual plate may also be provided.

21 Claims, 8 Drawing Sheets

ASSEMBLY HAVING WAFER WITH IMAGE SENSOR CHIPS, A PHOTO-SENSITIVE ADHESIVE PATTERN AND PLATE THEREOF AND METHOD OF MANUFACTURING THE SAME

PRIORITY STATEMENT

This U.S. non-provisional application claims benefit of priority under 35 U.S.C. § 119 from Korean Patent Application No. 2005-1683, filed on Jan. 7, 2005, the entire contents of which are incorporated herein by reference.

BACKGROUND

1. Field of the Invention

The present invention relates generally to an image sensor chip and its manufacturing method and, more particularly, to an image sensor chip that may have a plate, a wafer for the image sensor chip that may have a plate, and a method that may be implemented to manufacture the image sensor chip.

2. Description of the Related Art

An image sensor module may capture images of a subject and may output electrical signals using a photoelectric converter and charge-coupled device, for example. The image sensor module may include a solid-state imaging device such as a charge-coupled device (CCD) and/or a CMOS image sensor (CIS), for example.

Image sensor modules may be implemented in digital cameras, digital camcorders, mobile phones, multimedia personal computers, and monitoring cameras, for example. The demand for image sensor modules may have increased.

Figure 1:
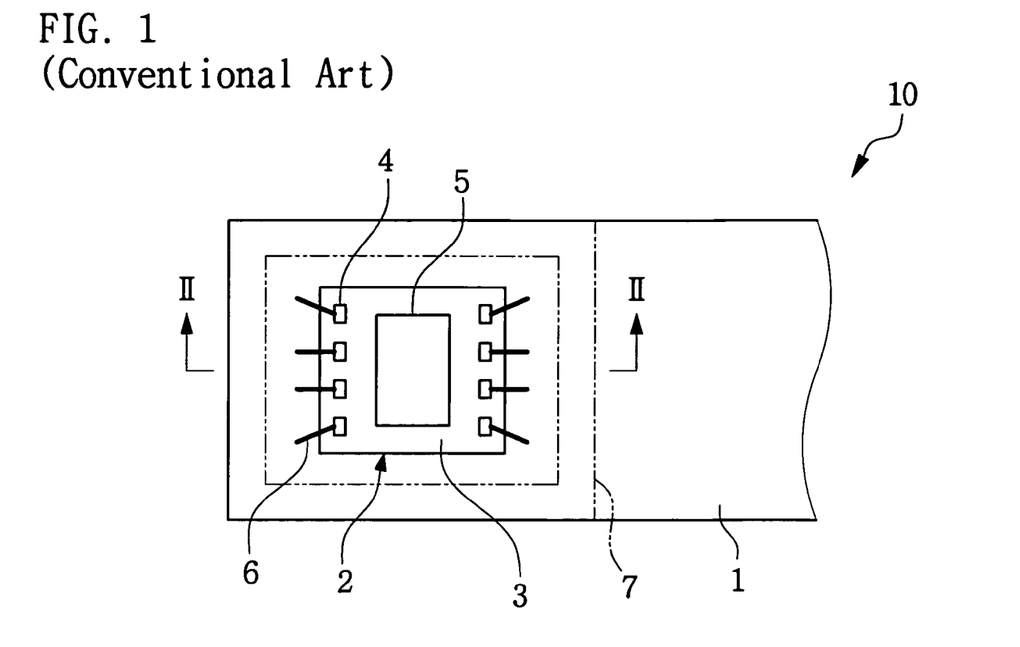
FIG. 1 is a top plan view of a conventional image sensor module.
Figure 2:
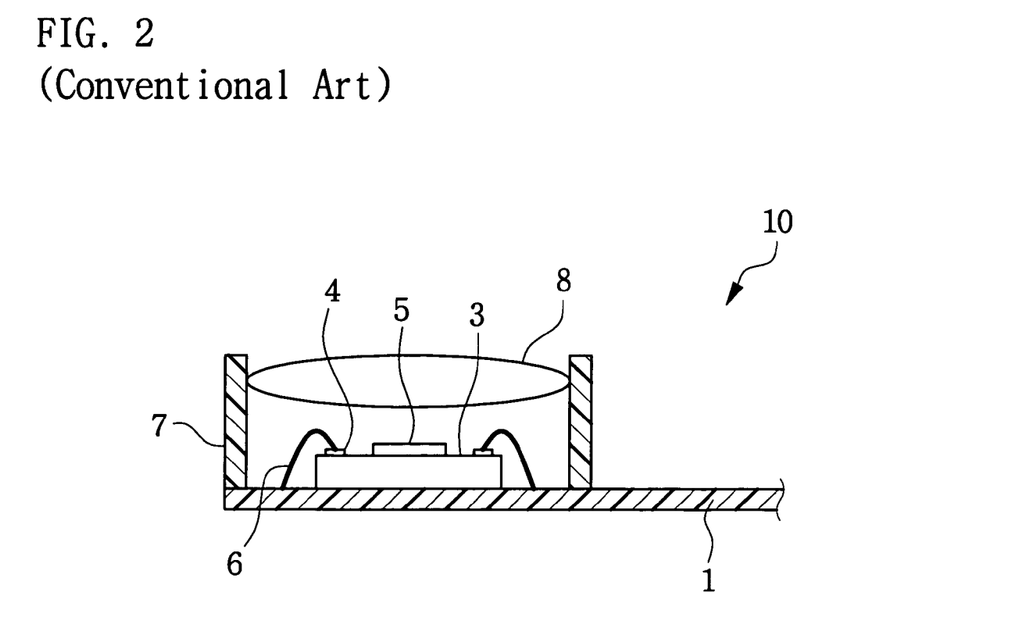
FIG. 2 is a cross-cross-sectional view of the conventional image sensor module taken along the line II-II in FIG. 1.

As shown in FIGS. 1 and 2, a conventional image sensor module 10 may include an image sensor chip 2 mounted on an upper surface of a circuit substrate 1 (e.g., a flexible circuit substrate). A lens unit 7 may be mounted on the upper surface of the circuit substrate 1. The lens unit 7 may surround a periphery of the image sensor chip 2.

Chip pads 4 may be provided on an active surface 3 of the image sensor chip 2. A micro-lens 5 may be provided on the active surface 3 of the image sensor chip 2. Bonding wires 6 may electrically connect the chip pads 4 of the image sensor chip 2 to the circuit substrate 1. A lens unit lens 8 may be mounted on the lens unit 7. The lens unit lens 8 may face the micro-lens 5.

During manufacture of the image sensor module 10, the active surface 3 of the image sensor chip 2 may be exposed prior to the lens unit 7 being mounted on the image sensor chip 2. Thus, particles in the air may adhere to (and contaminate) the micro-lens 5. Such contamination may decrease the desired functioning of the micro-lens 5, which may (in some cases) become a defective component in the finished image sensor module 10.

SUMMARY

According to an example, non-limiting embodiment, an assembly may include a wafer. The wafer may have image sensor chips. Each of the image sensor chips may have an active surface on which are provided chip pads and a micro-lens. A plate may be mounted on the wafer. A photo-sensitive adhesive pattern may be provided between the plate and a region of the active surface between the chip pads and the micro-lens.

According to another example, non-limiting embodiment of the invention, an image sensor device may include an image sensor chip. The image sensor chip may have an active surface on which are provided chip pads and a micro-lens. An individual plate may be mounted on the active surface of the image sensor chip. A photo-sensitive adhesive pattern may be provided between the plate and a region of the active surface between the chip pads and the micro-lens.

According to another example, non-limiting embodiment of the invention, a method may involve providing a wafer having image sensor chips and scribe lines demarcating each of the image sensor chips. Each of the image sensor chips may include an active surface on which are provided chip pads and a micro-lens. A plate may be mounted on the wafer using a photo-sensitive adhesive pattern provided between the plate and a region of the active surface between the chip pads and the micro-lens. The wafer having the plate mounted thereon may be separated along the scribe lines.

According to another example, non-limiting embodiment, an image sensor device may include an image sensor chip having an active surface on which are provided at least one chip pad and a micro-lens. An individual plate may be mounted on the active surface of the image sensor chip. The individual plate may have at least one hole through which the at least one chip pads may be exposed.

BRIEF DESCRIPTION OF THE DRAWINGS

Example, non-limiting embodiments of the present invention will be readily understood with reference to the following detailed description thereof provided in conjunction with the accompanying drawings, wherein like reference numerals designate like structural elements.

FIGS. 3 to 13 are schematic views of a method that may be implemented to manufacture an image sensor chip according to an example, non-limiting embodiment of the present invention.

The drawings are provided for illustrative purposes only and are not drawn to scale. The spatial relationships and relative sizing of the elements illustrated in the various embodiments may have been reduced, expanded or rearranged to improve the clarity of the figure with respect to the corresponding description. The figures, therefore, should not be interpreted as accurately reflecting the relative sizing or positioning of the corresponding structural elements that could be encompassed by an actual device manufactured according to the example, non-limiting embodiments of the invention.

DETAILED DESCRIPTION OF EXAMPLE, NON-LIMITING EMBODIMENTS

Example, non-limiting embodiments of the present invention will be described in detail with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

Well-known structures and processes are not described or illustrated in detail to avoid obscuring the present invention.

An element is considered as being mounted (or provided) "on" another element when mounted (or provided) either directly on the referenced element or mounted (or provided) on other elements overlaying the referenced element. Throughout this disclosure, the terms "upper" and "lower" are used for convenience in describing various elements or portions or regions of the elements as shown in the figures. These terms do not, however, require that the structure be maintained in any particular orientation.

FIGS. 3 to 13 are schematic views of a method that may be implemented to manufacture an image sensor chip according to an example, non-limiting embodiment of the present invention.

Figure 3:
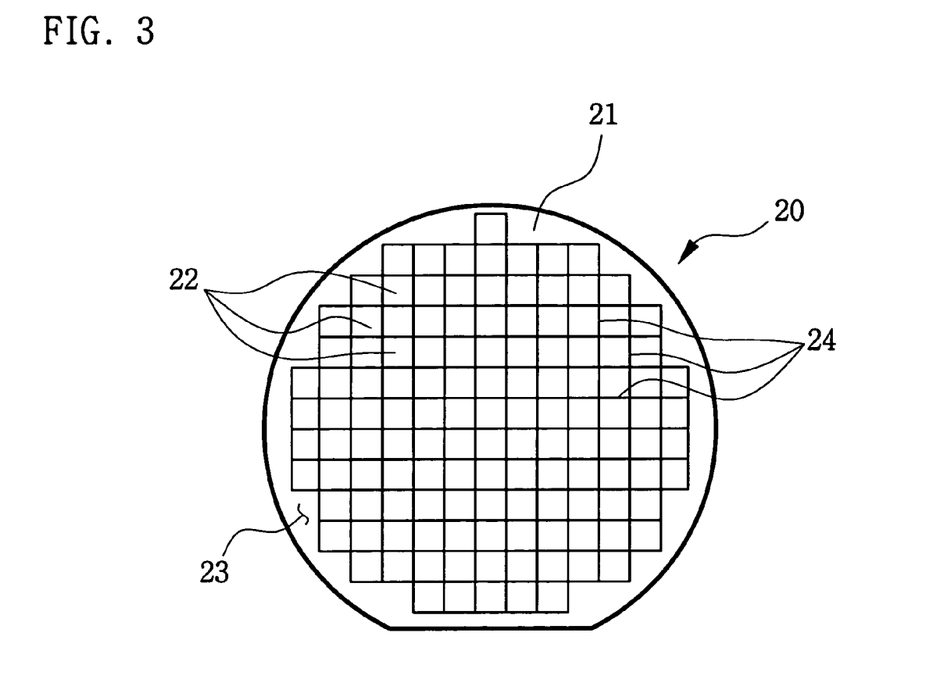
FIG. 3 is a top plan view of a wafer for image sensor chips.

A wafer 20 may include image sensor chips 22. As shown in FIG. 3, the image sensor chips 22 may be provided on a substrate 21. The substrate 21 may be fabricated from silicon, for example. In other embodiments, the substrate 21 may be fabricated from numerous other materials that are well known in this art. The substrate 21 may include scribe lines 24 that may demarcate each image sensor chip 22. The details of integrated circuits constituting the image sensor chips 22 are not necessary for an understanding of the present invention. Moreover, such details are well known in this art, so they are not explained in the present specification.

Figure 4:
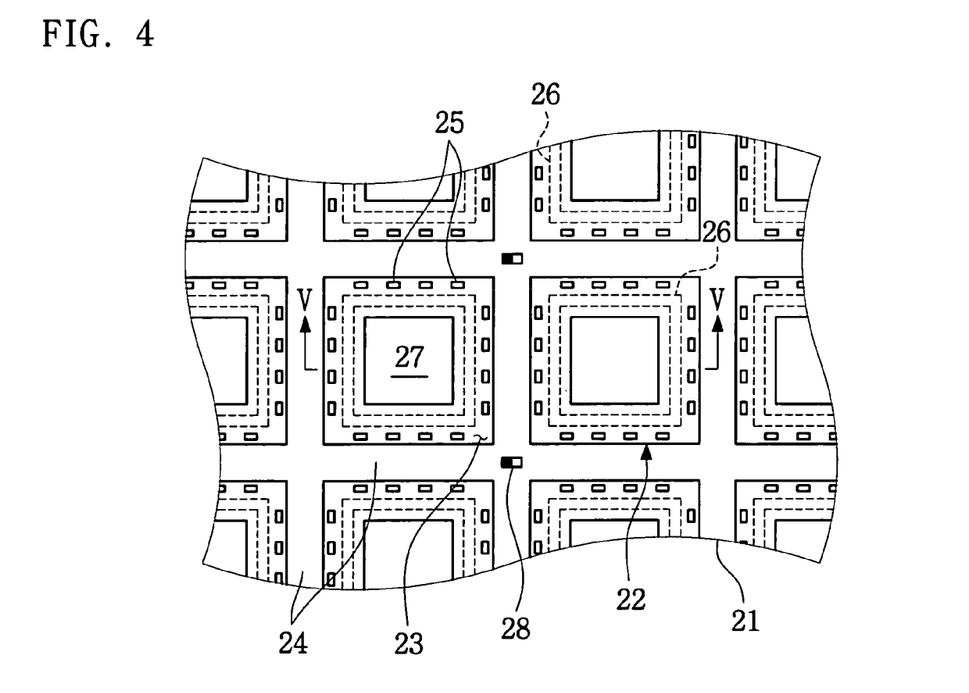
FIG. 4 is a partial top plan view of the image sensor chips of FIG. 3.
Figure 5:
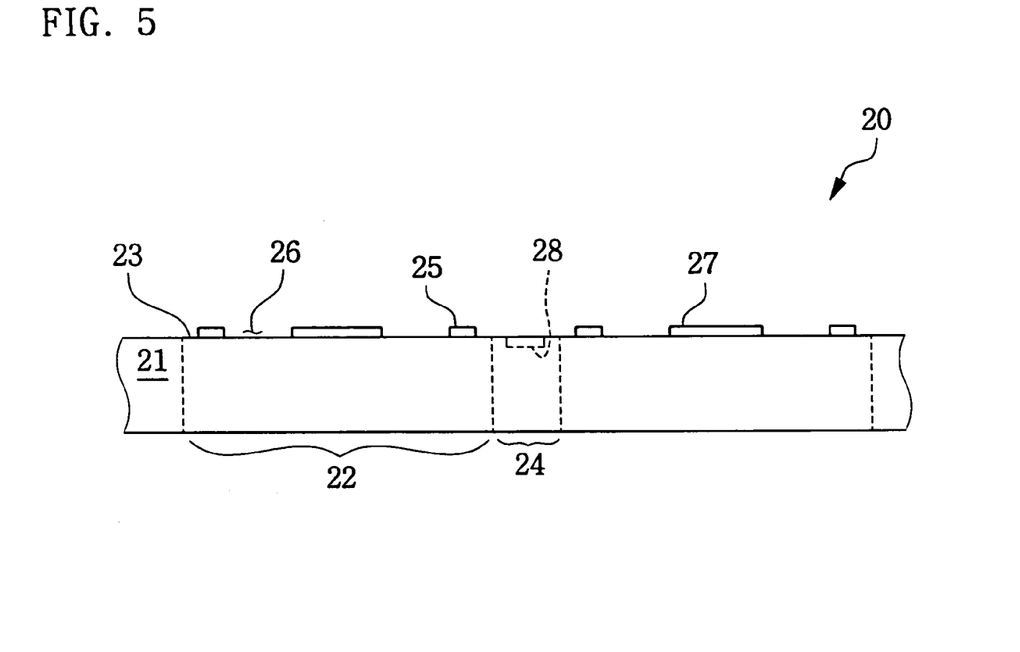
FIG. 5 is a cross-sectional view of the image sensor chips taken along the line V-V in FIG. 4.

As shown in FIGS. 4 and 5, a plurality of chip pads 25 may be provided on an active surface 23 of each image sensor chip 22. A micro-lens 27 may be provided on the active surface 23 of each image sensor chip 22. In this example embodiment, the micro lens 27 may be centrally located on the active surface 23 relative to the chip pads 25. In alternative embodiments, the micro lens 27 and the chip pads 25 may be provided at numerous other locations on the active surface 23. An adhesion region 26 of the active surface 23 may be located between the micro-lens 27 and the chip pads 25.

Alignment marks 28 may be provided on the active surface 23 of the wafer 20. In this example embodiment, the alignment marks 28 may be flush with the active surface 23. In alternative embodiments, the alignment marks 28 may be raised and/or recessed relative to the active surface 23. In this example embodiment, the alignment marks 28 may be located at intersections of the scribe lines 24. In alternative embodiments, the alignment marks 28 may be located at other sites (e.g., where the image sensor chips 22 are not provided), such as the periphery of the wafer 20, for example. The alignment marks 28 may be formed during integrated circuit fabrication. The alignment marks 28 may have a shape readily recognizable by an optical instrument such as a camera, for example. In this example embodiment, the alignment marks 28 may have a rectangular shape. In alternative embodiments, the alignment marks 28 may have any other geometric shape.

Figure 6:
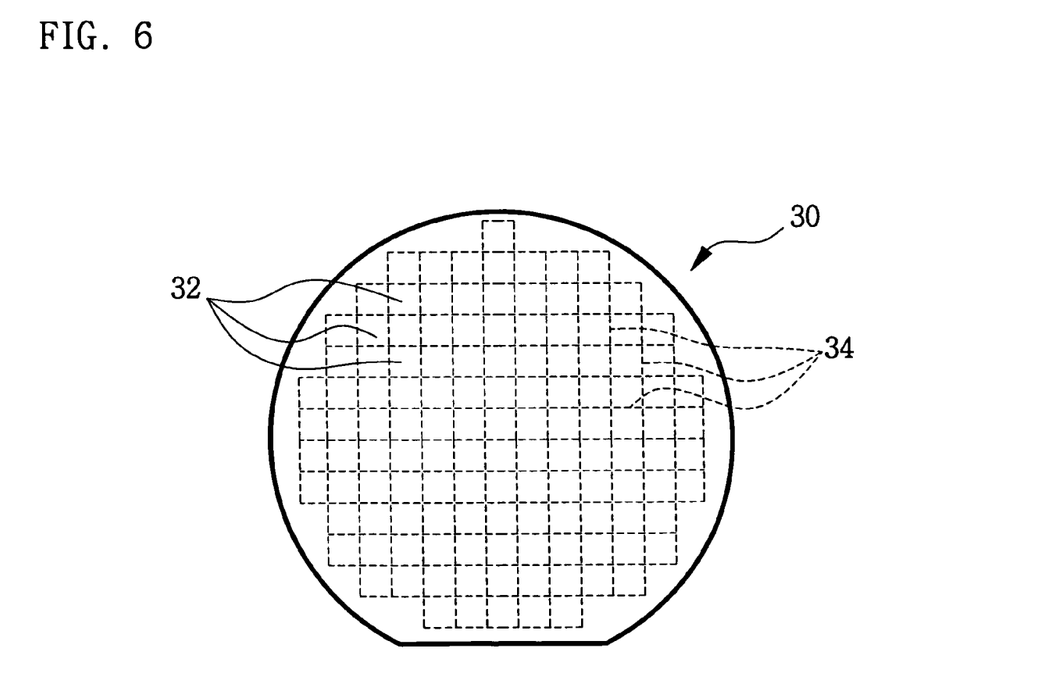
FIG. 6 is a top plan view of a plate.
Figure 7:
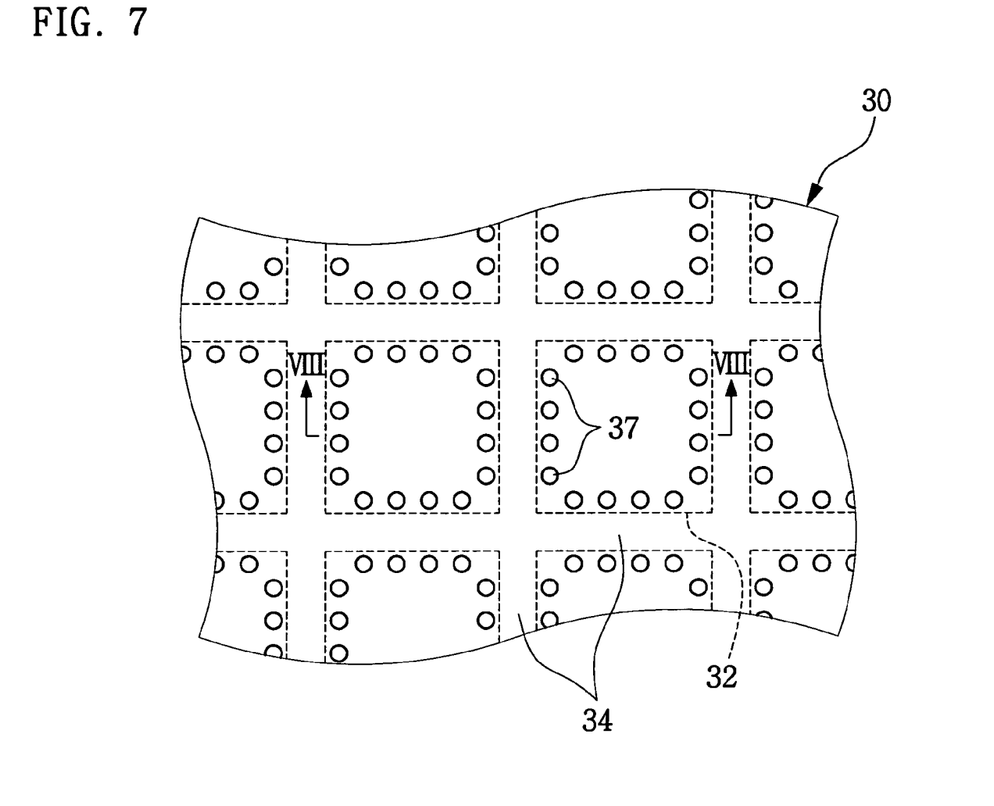
FIG. 7 is a partial top plan view of through holes that may be provided in the plate of FIG. 6.
Figure 8:
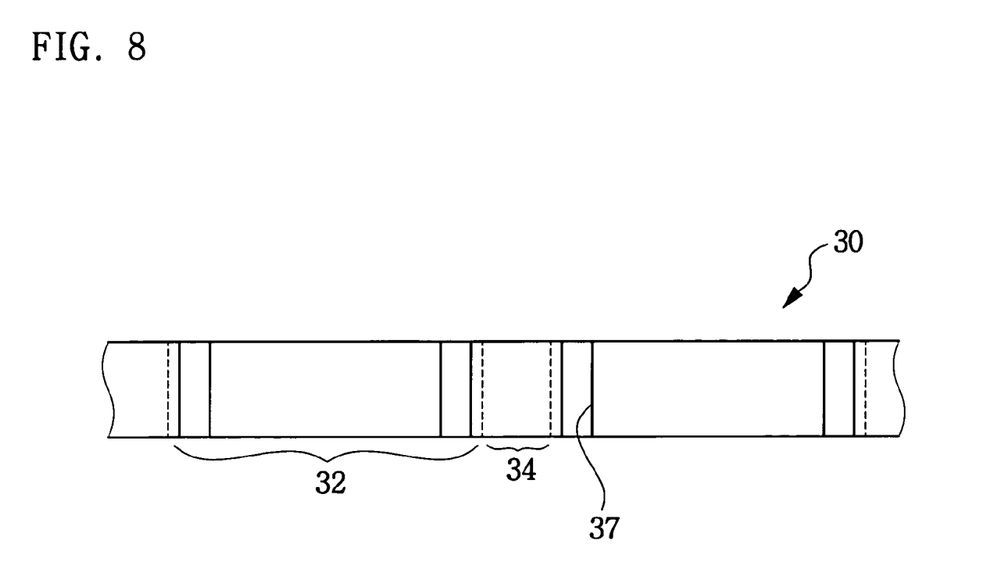
FIG. 8 is a cross-sectional view of the plate taken along the line VIII-VIII in FIG. 7.

As shown in FIGS. 6 to 8, a plate 30 may be provided. The plate 30 may have the same shape as the wafer 20. In alternative embodiments, the plate 30 may be shaped differently than the wafer 20. The plate 30 may have through holes 37. The through holes 37 may be provided at locations corresponding to the locations of the chip pads 25 provided on the image sensor chip 22. In this example embodiment, each through hole 37 may have a circular shape. In alternative embodiments, the through holes 37 may have any other geometric shape. The through holes 37 may be of a sufficient size to facilitate a wire bonding process in which a bonding wire may be inserted into the trough hole 37 and connected to an underlying chip pad 25. The plate 30 may be a transparent plate such as a glass or quartz plate, for example. The plate 30 may include individual plates 32 that may be respectively mounted on the image sensor chips 22 of the wafer 20. The plate 30 may include plate scribe lines 34 demarcating each individual plate 32. The plate scribe lines 34 may correspond to the scribe lines 24 of the wafer 20. Through holes 37 may be provided in each individual plate 32.

Figure 9:
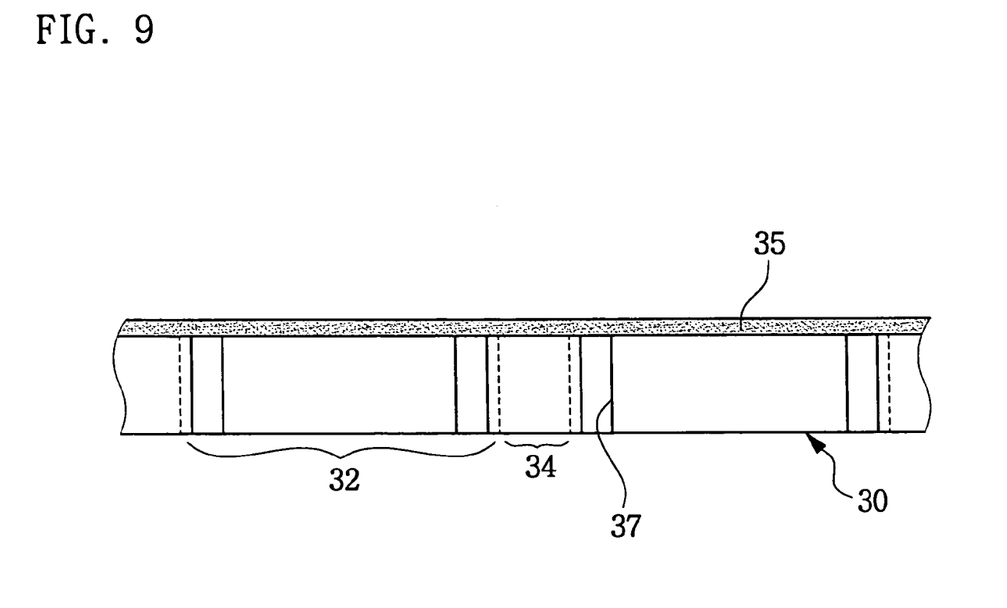
FIG. 9 is a cross-sectional view of an adhesive layer that may be provided on an upper surface of the plate.

As shown in FIG. 9, an adhesive layer 35 may be provided on a surface of the plate 30. In this example embodiment, the adhesive layer 35 may be a photo-sensitive adhesive layer 35, for example. The photo-sensitive adhesive layer 35 may be provided by a spray method, spin-on dispensing method, a vaporization method, and/or dry film attachment method, for example.

According to an example spray method, a photo-sensitive adhesive may be sprayed on a surface of the plate 30 to provide the photo-sensitive adhesive layer 35. According to an example spin-on dispensing method, a photo-sensitive adhesive may be dispensed on a surface of the plate 30 (e.g., at a central location of the plate 30), and then the plate 30 may be rotated to spread the adhesive. According to an example vaporization method, a photo-sensitive adhesive may be deposited by vaporization on a surface of the plate 30. According to an example dry film attachment method, a photo-sensitive adhesive film may be provided on a surface of the plate 30.

A protective film (not shown) may be provided on the other surface of the plate 30. The protective film may be provided before forming the photo-sensitive adhesive layer 35. The protective film may be removed after applying the photo-sensitive adhesive layer 35 onto the plate 30. The protective film may temporarily close the through holes 37 when the photo-sensitive adhesive layer 35 is being applied.

The photo-sensitive adhesive layer 35 may have a sufficient thickness so that the plate 30 may be mounted on the wafer 20 above the micro-lenses 27.

The photo-sensitive adhesive layer 35 may be fabricated from a photo-sensitive polymer, for example, that may be patterned through photolithography techniques.

Figure 10:
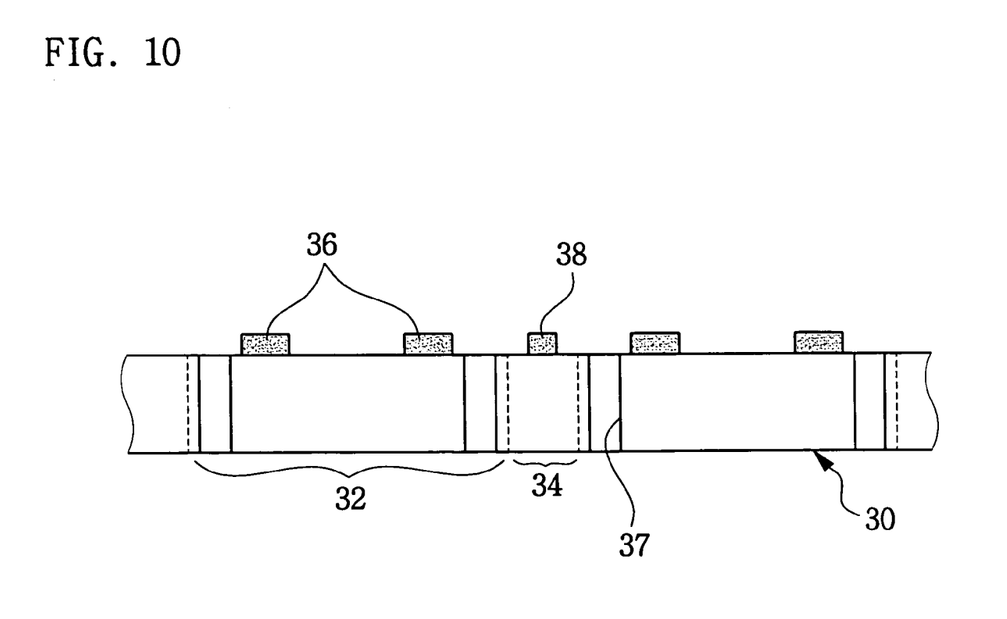
FIG. 10 is a cross-sectional view of adhesive patterns that may be provided on the plate.

As shown in FIG. 10, a photo-sensitive adhesive pattern 36 may be provided by patterning the photo-sensitive adhesive layer 35. The photo-sensitive adhesive pattern 36 may provided by applying well known photolithography techniques to the photo-sensitive adhesive layer 35. For example, the photo-sensitive adhesive pattern 36 may be provided via photolithography by leaving intact a portion of the photo-sensitive adhesive layer 35 corresponding to the adhesion region (26 of FIGS. 4 and 5) of the image sensor chips 22, and removing other portions of the photo-sensitive adhesive layer 35. A hardening process may not yet be applied to the photo-sensitive adhesive pattern 36 for maintaining adhesive properties of the photo-sensitive adhesive pattern 36.

During patterning, a plate alignment mark 38, fabricated from the photo-sensitive adhesive layer 35, may be provided on the plate 30 at a location corresponding to the alignment mark (28 of FIGS. 4 and 5) of the wafer 20. The plate alignment mark 38 may be provided at an intersection of the plate scribe lines 34. In alternative embodiments, the plate alignment marks 38 may be provided at other alternative locations of the plate 30. The plate alignment marks 38 may have any geometric shape.

In alternative embodiments, the adhesive pattern 36 and the plate alignment marks 38 may be fabricated from an adhesive other than a photo-sensitive adhesive. For example, an alternative adhesive may be dispensed onto the plate 30 at the desired locations to provide the desired adhesive patter 36 and the plate alignment marks 38, thereby avoiding the patterning process. Numerous and alternative adhesives, which are well known in this art, may be suitably implemented. Further, the adhesive pattern 36 may be provided on the wafer 20 instead of the plate 30.

Figure 11:
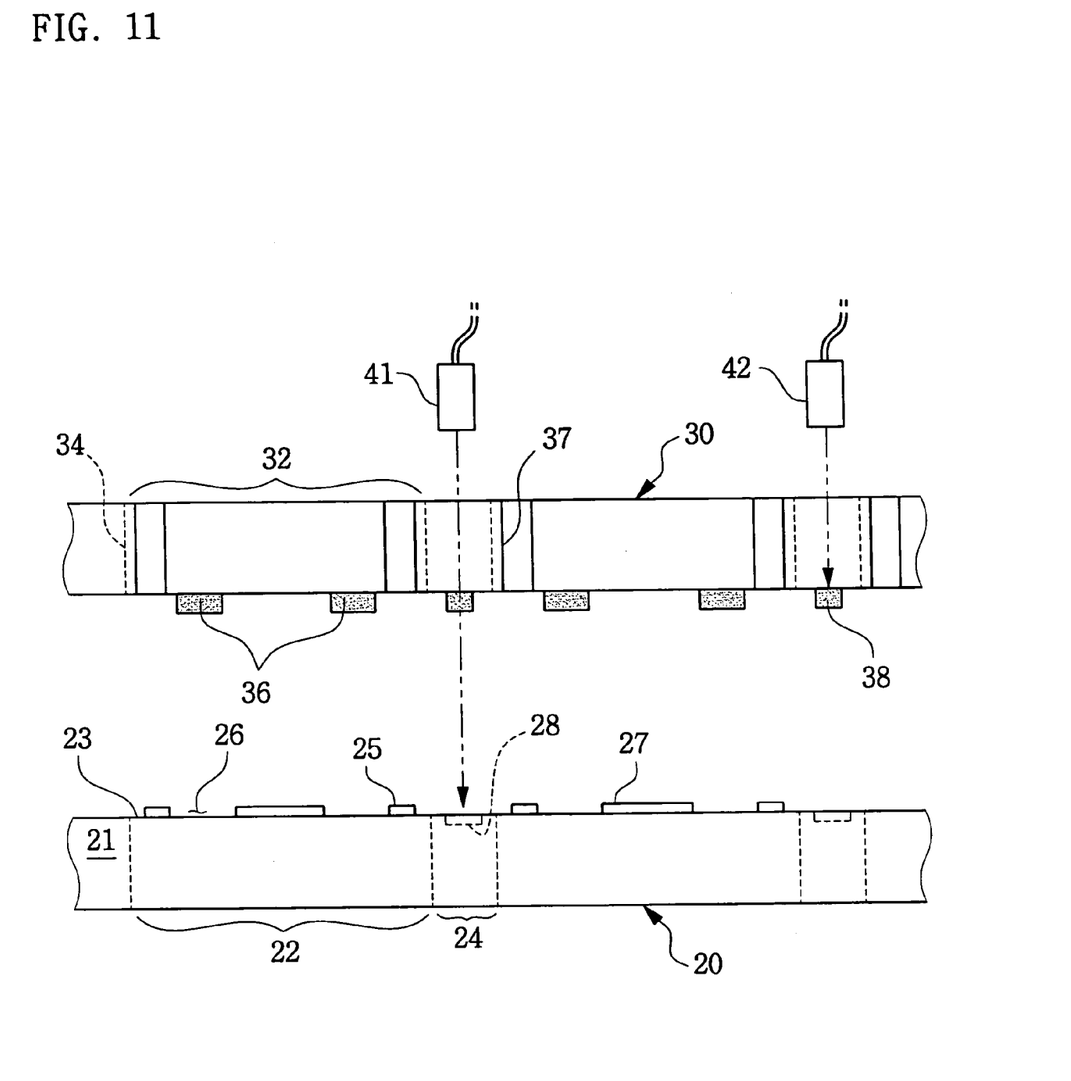
FIG. 11 is a cross-sectional view of the plate superposed over the wafer.

As shown in FIG. 11, the plate 30 may be aligned with the active surface 23 of the wafer 20. For example, the plate 30 may be positioned above the wafer 20 so that the photo-sensitive adhesive pattern 36 may face the active surface 23 of the wafer 20 and may be aligned with the adhesion region 26 of the image sensor chip 22. The chip pad 25 of the image sensor chip 22 may also be aligned with the through hole 37 of the individual plate 32.

The alignment between the wafer 20 and the protection plate 30 may be achieved utilizing the alignment marks 28 and the plate alignment marks 38. For example, the alignment marks 28 and the plate alignment marks 38 may be recognized by a first and a second optical instrument 41 and 42, respectively. The first and the second optical instruments 41 and 42 may be positioned above the plate 30. The first optical instrument 41 may recognize an alignment mark 28 of the wafer 20, record its coordinates, and transfer them to the second optical instrument 42. With fixed coordinates, the second optical instrument 42 may move the protection plate 30 until it may recognize a plate alignment mark 38, thereby aligning the alignment mark 28 and the plate alignment mark 38. Consequently, the photo-sensitive adhesive pattern 36 may be aligned with the adhesion region 26 of the image sensor chip 22. Other alternative alignment techniques that are well known in this art may be suitably implemented.

Figure 12:
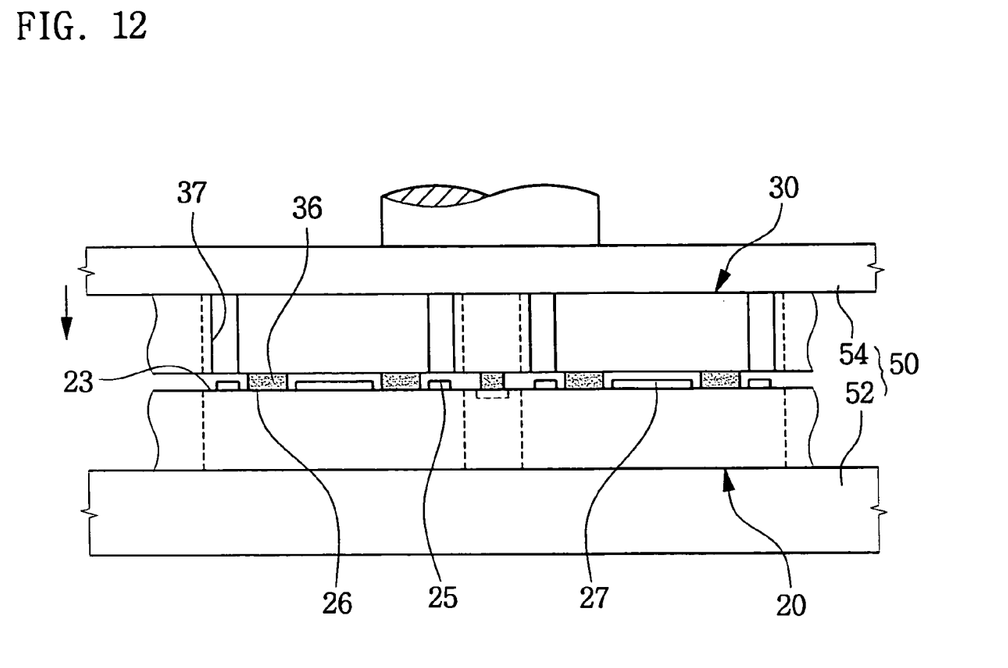
FIG. 12 is a cross-sectional view of the plate mounted on the wafer.

As shown in FIG. 12, the plate 30 may be mounted on the active surface 23 of the wafer 20 by thermo-compression, for example. The photo-sensitive adhesive pattern 36 of the plate 30 may adhere to the adhesion region 26 of the image sensor chip 22 by thermo-compression, for example. The chip pad 25 of the image sensor chip 22 may be exposed through the through hole 37 of the individual plate 32.

For example, the wafer 20 having the plate 30 mounted thereon may be loaded on a heater 52 of a thermo-compressor 50. The heater 52 may heat the wafer 20 and the plate 30 to a temperature suitable for the thermo-compression. A press 54 of the thermo-compressor 50 may move down, and press against the plate 30 for a designated time duration, thereby hardening the photo-sensitive adhesive pattern 36. The plate 30 may be fixed to the wafer 20 by the hardened photo-sensitive adhesive pattern 36. The press 54 may move up, and the wafer 20 having the plate 30 mounted thereon may be unloaded from the thermo-compressor 50.

The plate 30 may be positioned above the active surface 23 of the wafer 20 via the photo-sensitive adhesive pattern 36 so that a space may remain between the micro-lens 27 and the plate 30.

Figure 13:
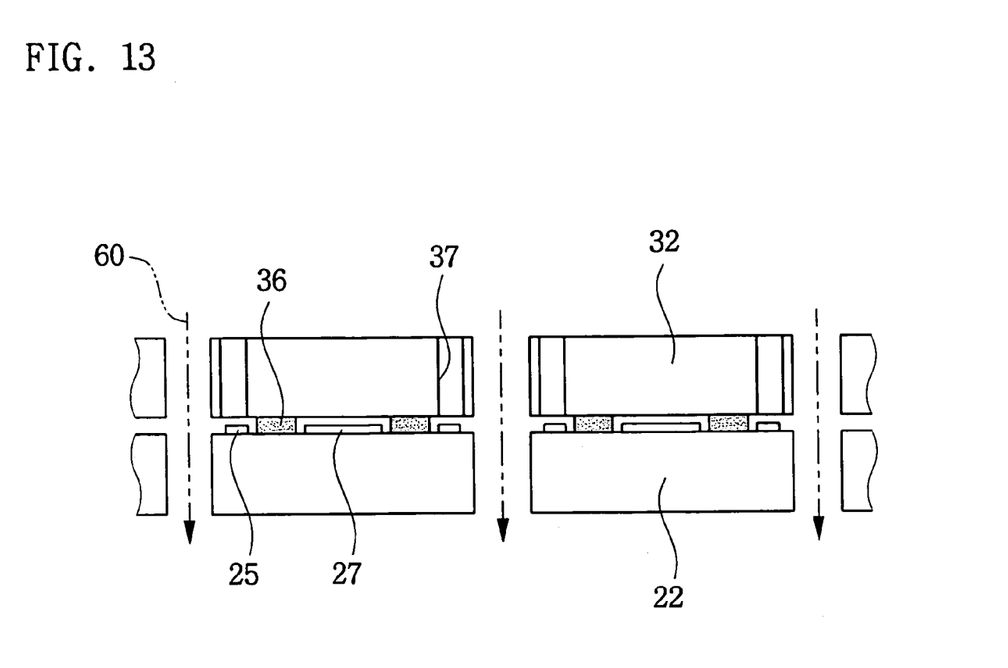
FIG. 13 is a cross-sectional view of dividing the wafer into image sensor chips.

As shown in FIG. 13, the wafer 20 having the plate 30 may be separated into individual image sensor chips 22. For example, the wafer 20 having the plate 30 may be cut along the scribe lines of the wafer 20 with a cutting device 60 to separate the wafer-plate assembly into individual image sensor chips 22 having individual protection plates 32, respectively.

The individual plates 32 may be simultaneously mounted on the image sensor chips 22 of the wafer 20. Thus, the image sensor chips 22 having the individual plate 32 may be manufactured efficiently.

Figure 14:
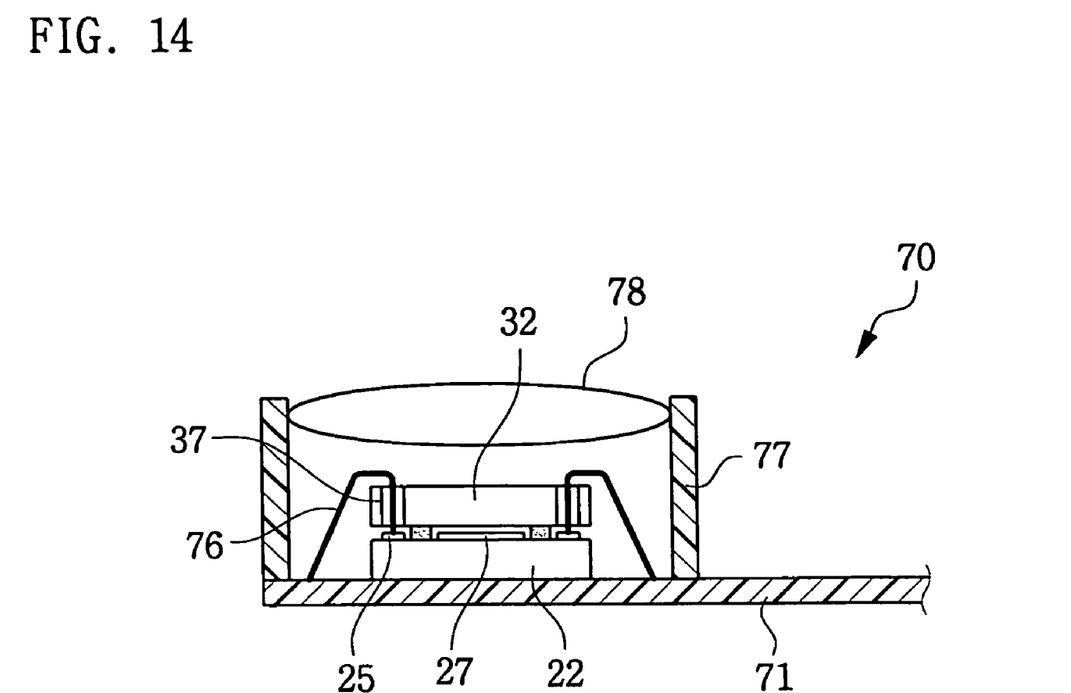
FIG. 14 is a cross-sectional view of an image sensor module according to an example, non-limiting embodiment of the present invention.

In addition, the chip pad 25 of the image sensor chip 22 may be exposed through the through hole 37 of the individual plate 32, and therefore the image sensor chip 22 may be implemented in an image sensor module 70, as shown in FIG. 14.

With reference to FIG. 14, the image sensor chip 22 supporting the individual plate 32 may be mounted on a circuit substrate 71 (e.g., a flexible circuit substrate). A bonding wire 76 may electrically connect the chip pad 25 of the image sensor chip 22, exposed through the through hole 37 of the individual plate 32, to the circuit substrate 71. Numerous and alternative wire bonding techniques, which are well known in this art, may be suitably implemented. A lens unit 77 may be mounted on the circuit substrate 71. The lens unit 77 may enclose a periphery of the image sensor chip 22. A lens unit lens 78 may be mounted so as to face the micro-lens 27.

The individual plate 32 may shield the micro-lens 27 of the image sensor chip 22 from the external environment at a wafer level. In this way, the individual plate 32 may reduce (and/or altogether prevent) contamination of the micro-lens 27 by particles that may be present in the manufacturing environment during manufacture of the image sensor module 70.

While example, non-limiting embodiments of the invention have been shown and described in this specification, it will be understood by those skilled in the art that various changes and/or modifications of the embodiments are possible without departing from the spirit of the invention as defined by the appended claims.

What is claimed is:

1. An assembly comprising:
   a wafer including image sensor chips, each of the image sensor chips having an active surface on which are provided chip pads and a micro-lens;
   a plate mounted on the wafer; and
   a photo-sensitive adhesive pattern provided between the plate and a region of the active surface between the chip pads and the micro-lens.

2. The assembly of claim 1, wherein the photo-sensitive adhesive pattern is fabricated from a photo-sensitive polymer.

3. The assembly of claim 2, wherein the photo-sensitive adhesive pattern has a thickness such that the plate is spaced apart from the micro-lens of the image sensor chip.

4. The assembly of claim 3, wherein the plate includes through holes corresponding to the chip pads of the image sensor chip.

5. The assembly of claim 1, wherein the plate is fabricated from at least one of glass and quartz.

6. An image sensor device comprising:
   an image sensor chip having an active surface on which are provided chip pads and a micro-lens; and an individual plate mounted on the active surface of the image sensor chip; and a photo-sensitive adhesive pattern provided between the plate and a region of the active surface between the chip pads and the micro-lens.

7. The image sensor device of claim 6, wherein the photo-sensitive adhesive pattern is fabricated from a photo-sensitive polymer.

8. The image sensor device of claim 7, wherein the photo-sensitive adhesive pattern has a thickness such that the individual plate is spaced apart from the micro-lens.

9. The image sensor device of claim 8, wherein the individual plate covers the active surface of the image sensor chip.

10. The image sensor device of claim 9, wherein the individual plate includes through holes corresponding to the chip pads of the image sensor chip.

11. The image sensor device of claim 6, wherein the individual plate is fabricated from at least one of glass and quartz.

12. A method comprising:

providing a wafer having image sensor chips and scribe lines demarcating each of the image sensor chips, each of the image sensor chips including an active surface on which are provided chip pads and a micro-lens;

mounting a plate on the wafer using a photo-sensitive adhesive pattern provided between the plate and a region of the active surface between the chip pads and the micro-lens; and separating the wafer along the scribe lines into individual image sensor chips including the plate mounted thereon.

13. The method of claim 12, wherein mounting the plate comprises:

providing a photo-sensitive adhesive layer on a surface of the plate;

patterning the photo-sensitive adhesive layer to provide the photo-sensitive adhesive pattern; and aligning the plate with the wafer so that the photo-sensitive adhesive pattern corresponds to a region of the active surface between the chip pads and the micro-lens; and thermo-compressing the plate to the wafer.

14. The method of claim 13, wherein the photo-sensitive adhesive layer is provided by a method selected from the group consisting of spraying, spin-on dispensing, vaporization, and dry film attaching.

15. The method of claim 13, wherein the photo-sensitive adhesive layer is fabricated from a photo-sensitive polymer.

16. The method of claim 13, wherein the photo-sensitive adhesive layer is patterned via photolithography.

17. The method of claim 16, wherein the photo-sensitive adhesive pattern has a thickness such that the plate is spaced apart from the micro-lens.

18. The method of claim 17, wherein the plate includes through holes corresponding to the chip pads of the image sensor chip.

19. The method of claim 12, wherein the plate is fabricated from at least one of glass and quartz.

20. An image sensor device comprising:

an image sensor chip having an active surface on which are provided at least one chip pad and a micro-lens; and an individual plate mounted on the active surface of the image sensor chip, the individual plate having at least one hole through which the at least one chip pad is exposed.

21. The image sensor device of claim 20 further comprising:

an adhesive provided between the individual plate and a region of the active surface between the at least one chip pad and the micro lens.

* * * * *